United States Patent [19]

Tanimura et al.

[11] 3,790,869

[45] Feb. 5, 1974

[54] HUMIDITY SENSITIVE SEMICONDUCTOR DEVICE

[75] Inventors: Shigeru Tanimura, Kyoto; Nobuaki Miura, Nagaokakyo; Osamu Asano, Nagaokakyo; Nobuyuki Yamamura, Takatsuki, all of Japan

[73] Assignee: Omron Tateisi Electronics Co., Okyo-ku, Kyota, Japan

[22] Filed: Nov. 8, 1972

[21] Appl. No.: 304,808

[30] Foreign Application Priority Data

Nov. 10, 1971 Japan ........................... 46-90138
Mar. 21, 1972 Japan ........................... 47-28789

[52] U.S. Cl.... 317/235 T, 317/234 T, 317/235 AG, 317/235 UA

[51] Int. Cl. ............................................ H01l 9/00

[58] Field of Search .........317/235 N, 234 T, 235 T, 317/235 AG, 235 B, 234 UA, 235 AC

[56] References Cited

UNITED STATES PATENTS

| | | | |
|---|---|---|---|
| 3,329,823 | 7/1967 | Hanoy et al. | 250/211 |
| 3,348,074 | 10/1967 | Diemer | 307/88.5 |
| 3,391,309 | 7/1968 | Hacskaylo | 317/235 |
| 3,416,044 | 12/1968 | Dreyfus et al. | 317/234 |
| 3,497,698 | 2/1970 | Phelan et al. | 250/212 |
| 3,586,533 | 6/1971 | Cubert et al. | 117/212 |
| 3,596,151 | 7/1971 | Eldridge et al. | 317/235 |
| 3,679,949 | 7/1972 | Vekusa et al. | 317/238 |

OTHER PUBLICATIONS

Chem. Abstracts, "Eff. of Light, Oxygen, and Water on the Elec. Cond. of CDO and $SNO_2$," p. 9068, Vol. 55, May 1961.

T. Seiyama et al., "Study on a Det. For Gas Components Using Semicond. Thin Films," Anal. Chem., Vol. 38, No. 8, July 1966, pp. 1069–1073.

S. Kar et al., "Pot. and Dir. Cur. in Si-(20-40A) $SiO_2$-Metal Str.," S.-S. Electr., Sept. 22, 1972, pp. 869–875.

M. Turner et al., "Metal-Silicon Schottky Barriers," S.-S. Electronics, Vol. 11, 1968, pp. 291-300.

*Primary Examiner*—Rudolph V. Rolinec
*Assistant Examiner*—Joseph E. Clawson, Jr.
*Attorney, Agent, or Firm*—Staas, Halsey & Gable

[57] ABSTRACT

A semiconductor composite having a rectifying and humidity sensitive characteristic is provided by depositing a tin oxide film on a semiconductor substrate, preferably with an insulating film of a semiconductor compound such as $SiO_2$ of a thickness of 15Å to 500Å therebetween, and by exposing a portion of the barrier to the atmosphere. It was observed that the rectifying characteristic of the composite becomes easy at a quick response rate at an avalanche current region as the ambient relative humidity is increased and that the composite as supplied with a predetermined reverse bias voltage higher than a breakdown voltage of the composite shows a change in the reverse current at a quick response rate in reverse proportion to the relative humidity of the atmosphere. It was also observed that interposition of the insulating film between the $SnO_2$ film and the semiconductor substrate in a preferred embodiment decreases the reverse leakage current, raises the reverse breakdown voltage and makes uniform the reverse breakdown voltage.

27 Claims, 10 Drawing Figures

PATENTED FEB 5 1974 3,790,869

HUMIDITY SENSITIVE SEMICONDUCTOR DEVICE

BACKGROUND OF THE INVENTION

1. Field of the Invention

The present invention relates to a humidity sensitive semiconductor device. More specifically, the present invention relates to a humidity sensitive semiconductor device utilizing a semiconductor composite comprising a tin oxide film deposited on a semiconductor substrate and having a rectifying characteristic.

2. Description of the Prior Art

Typical conventional humidity sensitive semiconductor devices utilize a semiconductor material such as magnetite, selenium, potassium metaphosphate or the like, electrical conductivity of which is changeable as a function of humidity absorbed into a film of such material. It is well known in the art that the electrical conductivity of the abovementioned materials increases according to the increase of the environmental humidity around the said material film.

Nevertheless, the conventional humidity sensitive semiconductor devices as mentioned above are disadvantageous in that a response rate thereof to the humidity is very slow. The reason is said to be that the abovementioned prior art devices utilize a change of electrical conductivity of the material thereof caused by water molecules as absorbed into the material as a function of the ambient humidity of the device. For example, a magnetite thin film takes 5 to 7 minutes in order to respond to a change of relative humidity from 98 percent to 12 percent, and a selenium thin film takes 2 minutes to respond to a change of relative humidity from 80 to 40 percent. Although a potassium metaphosphate thin film is rather preferred in that it responds as quickly as 2 seconds to a change of relative humidity from 80 to 33 percent, it is again disadvantageous because the characteristic of the device is largely varied during lapse of time. The magnetite thin film and the selenium thin film also suffer from the shortcomings of such secular variation of the characteristic. Other problems are that the range of relative humidity to which the abovementioned prior art devices can respond is narrow, that the response to the humidity of the prior art devices is not so accurate, that such devices are liable to be lack in uniformity of the characteristic, that such devices are expensive, etc. Thus the abovementioned conventional devices are of less utility.

It is also known to those skilled in the art that existing semiconductor devices having a PN junction are sensitive to the humidity in which the devices are placed. More specifically, such semiconductor devices show, in a quick response manner, a change of the reverse leakage current in direct proportion to the change of relative humidity. This means that an increased leakage current will flow at higher relative humidity. Apparently, the increased leakage current is undesirable in the actual use of the device. The change of the reverse current in response to the change of humidity is much too small. For the above reasons the semiconductor devices having a PN junction are of extremely little utility and in fact have not been in practical use as a humidity sensitive device.

A prior art patent of interest which discloses a basic structural feature of the present invention is U.S. Pat.

No. 3,679,949, entitled "SEMICONDUCTOR HAVING TIN EXIDE LAYER AND SUBSTRATE," issued July 25, 1972 to Genzo Uekusa et al. and assigned to the same assignee of the present invention. The referenced patent basically discloses a semiconductor composite comprising a film of tin exide ($SnO_2$) deposited on a semiconductor substrate such as silicon and having a rectifying and photoelectric characteristic therebetween. More specifically, the referenced patent discloses such composite obtained by a process comprising the steps of heating an N-type silicon single crystal substrate in a quartz tube, introducing a vapor of a tin salt such as dimethyl tin dichloride ($(CH_3)_2SnCl_2$) into said quartz tube and having a tin oxide film deposited on said silicon substrate by pyrolysis. Such composite comprises a barrier formed between the tin oxide film and the silicon substrate, which barrier is presumably a Schottcky barrier and closely resembles a PN junction in a rectifying characteristic. Such barrier may be advantageously utilized as a rectifying device or photoelectromotive force device. As is well known, the tin oxide film is transparent and conductive. Hence, by so adapting the composite that the light is applied to said barrier through the tin oxide film, a photoelectric device is provided. The spectral characteristic of such photoelectric device is such that it is more highly sensitive in the visible wavelength region as compared with a conventional silicon photoelectric device. It also exhibits a higher output at lower illumination, and is satisfactory in temperature and response characteristic. Another advantage of the referenced patent composite is that the composite can be provided with ease and less cost on a mass production basis in view of the fact that the tin oxide layer may be deposited at a lower temperature as compared with a process employed in manufacture of the silicon photoelectric device.

Because of the abovementioned characteristic features of the referenced patent device, the referenced patent discloses and teaches application of the device as a photoelectric device and a rectifying device. As is well known to those skilled in the semiconductor art, carefull consideration is usually required to protect the junction region from environmental influence by covering the region with an insulating material film in manufacturing a photoelectric device or a rectifying device. Thus, the referenced patent neither teaches nor suggests a response to the ambient humidity of the device disclosed therein and application of the device as a humidity sensitive semiconductor device.

SUMMARY OF THE INVENTION

Briefly stated, the present invention basically comprises a semiconductor composite comprising a semiconductor and a film of tin oxide, preferably stannic oxide ($SnO_2$), deposited on a semiconductor substrate and having a rectifying characteristic, a portion of the barrier being exposed to the atmosphere. Preferably the material of said semiconductor substrate may be selected from a group consisting of Si, Ge and GaAs. It was observed that the rectifying characteristic of the composite becomes easy at a quick response rate at an avalanche current region as the ambient relative humidity is increased. It was also observed that the composite as supplied with a predetermined reverse bias voltage higher than a breakdown voltage of the composite shows a change in the reverse current at a quick response rate in reverse proportion to the relative humidity of the atmosphere.

A preferred embodiment of the present invention comprises a semiconductor substrate, an insulating film formed on said semiconductor substrate and a film of a tin oxide, preferably stannic oxide ($SnO_2$), deposited on said insulating film and having a rectifying characteristic, a portion of the barrier being exposed to the atmosphere. Preferably the material of said insulating film may be selected from a group consisting of $SiO_2$, $Si_3N_4$ and $GeO_2$. The thickness of the insulating film may be chosen to be 15A to 500A, but preferably the thickness of the insulating film may be chosen to be 15A to 300A and more preferably 20A to 100A. It was observed that interposition of the insulating film between the $SnO_2$ film and the semiconductor substrate in the preferred embodiment decreases the reverse leakage current, raises the reverse breakdown voltage and makes uniform the reverse breakdown voltage.

Therefore, an object of the present invention is to provide an improved semiconductor composite having a rectifying and humidity sensitive characteristic.

Another object of the present invention is to provide a humidity sensitive semiconductor device which comprises an $SnO_2$ film deposited on a semiconductor substrate.

A further object of the present invention is to provide a humidity sensitive semiconductor device which comprises an $SnO_2$ layer deposited on a semiconductor substrate, with an insulating film of a specific thickness intervening therebetween.

Still a further object of the present invention is to provide a semiconductor device the reverse current of which is in reverse proportion to the ambient relative humidity.

It is an object of the present invention to provide a humidity sensitive semiconductor device which is capable of measuring a broad region of the ambient relative humidity with high accuracy and high sensitivity and at a high response rate.

It is another object of the present invention to provide a humidity sensitive semiconductor device which is of a stable characteristic and is uniform in characteristic in mass production It is a further object of the present invention to provide a humidity sensitive semiconductor device which is small-sized and inexpensive.

These and other objects and features of the present invention will be better understood from the following detailed description in conjunction with the accompanying drawings.

BRIEF DESCRIPTION OF THE DRAWINGS

In all these figures like reference characters designate like parts.

Figure 1:
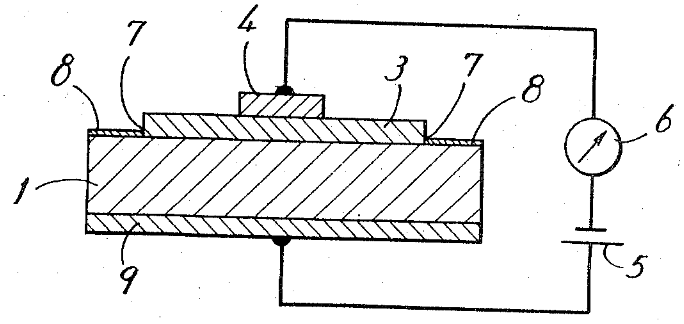
FIG. 1 shows, in section, a basic structural feature of a semiconductor composite in accordance with the present invention.

DESCRIPTION OF THE PREFERRED EMBODIMENTS:

Referring to FIG. 1, there is shown, in section, a basic structural feature of a semiconductor composite of an embodiment in accordance with the present invention. The composite shown basically comprises an N-type single crystal silicon substrate 1 with specific resistivity of 5 ohm cm and a layer 3 of tin oxide or stannic oxide ($SnO_2$) deposited on the said substrate 1. The composite is also shown comprising a metal electrode 4 formed on the $SnO_2$ layer 3, a metal electrode 9 formed on the substrate 1 and a circuit connection, including an ammeter 6 and a reverse bias voltage source 5 connected to both electrodes 4 and 9.

The $SnO_2$ layer of the composite is so chosen as to be well conductive and constitutes itself an N-type semiconductor. The conductivity of this $SnO_2$ layer is close to that of a metal, say about $10^{20}$ atoms/$cm^3$ in terms of free electron concentration. The $SnO_2$ layer having the characteristic of N-type semiconductor can be formed by a rapid chemical reaction yielding $SnO_2$. This is presumably accounted for by the excess of metal or shortage of oxygen resulting from the rapidity of the progress of reaction.

As more fully described in the referenced patent, it was discovered that the composite of such structure and composition has a rectifying characteristic and that such composite takes on a photoelectric function when radiation energy is supplied to the heterojunction formed inside the composite. One of the possible interpretations of the discovery is that said formation of heterojunction is actually formation of Schottky barrier between said $SnO_2$ and the semiconductor substrate, with $SnO_2$ being regarded as a metal.

In manufacture of the composite of the specific structure, in section, as shown in FIG. 1, first the $SnO_2$ film 3 is deposited on the main surface of the semiconductor substrate 1, and then the metal electrodes 4 and 9 are formed on the said $SnO_2$ film 3 and on the under surface of the substrate 1, respectively. A portion of the $SnO_2$ film 3 at the peripheral area thereof is then removed by a chemical etching process and, if desired, a portion of the metal electrode 4 at the peripheral area thereof is further removed by a chemical etching process to provide the semiconductor composite of structure, as shown in section in FIG. 1. As is well known to those skilled in the art, a portion of the main surface of the semiconductor substrate 1 as exposed as a result of removal of the $SnO_2$ film 3 will be thereafter covered again by a very thin film 8 of oxide such as silicon dioxide ($SiO_2$) formed through natural oxidization of the surface of the substrate 1.

Now that the structural features of the composite of the present invention have been described, a typical characteristic feature of the composite as a humidity sensitive semiconductor device will be hereinafter discussed by referring to various graphs. It is pointed out that such various characteristic features were obtained by using a specific example of the inventive composite comprising an N-type single crystal substrate of 5 ohm cm in resistivity and of 2mm square and 200$\mu$thick and a tin oxide film of 1mm $\phi$ and 0.6$\mu$thick.

Figure 2:
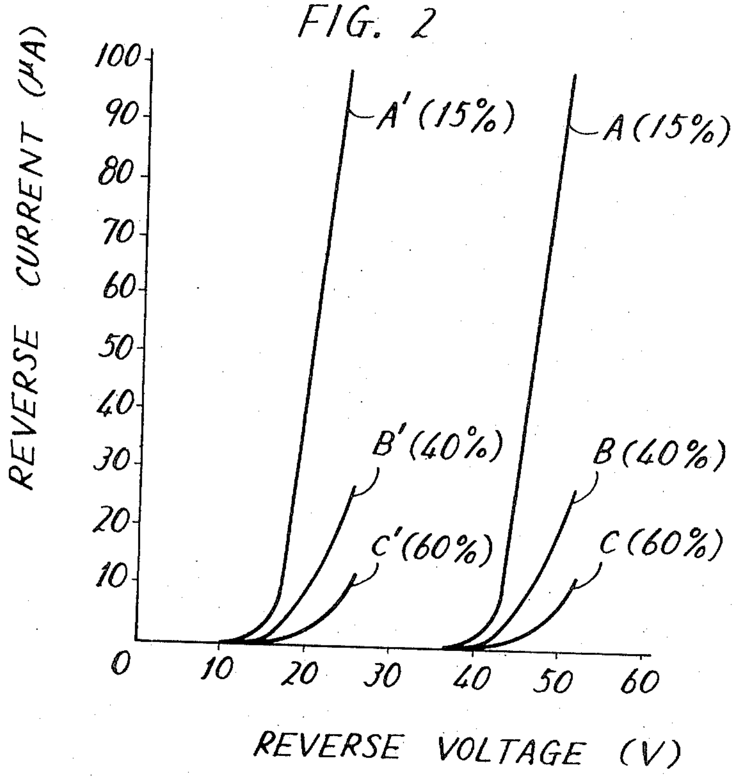
FIG. 2 is a graph showing several reverse voltage versus current characteristic curves of the FIG. 1 composite with several values of the relative humidity as a parameter.

The inventors of the present application discovered that the composite of such structure and composition, particularly with a peripheral portion of the barrier region exposed to the atmosphere, shows a pronounced and preferred response to the ambient humidity in which the composite is placed. More specifically, the inventors discovered that the composite as described in conjunction with FIG. 1 shows different reverse voltage-current characteristic curves in the rectifying characteristic as a function of the ambient humidity. FIG. 2 is a graph showing such different reverse voltage-current characteristic curves A, B and C of the composite with several values of the relative humidity as a parameter as indicated in parentheses of the respective curves. (Curves A', B' and C' in the graph will be discussed subsequently.) As seen from the graph, the reverse voltage-current characteristic curve of the composite becomes easy while the breakdown voltage is slightly changed to a higher value, as the humidity is increased.

It is presumed that the change of the reverse voltage-current characteristic as a function of the humidity occurs mainly at a barrier portion in the vicinity of the barrier exposed at the periphery 7 of the $SnO_2$ film. More specifically, the reason of the change is presumed to be that when water molecules are absorbed to a barrier portion as exposed to the atmosphere a depletion layer extends toward the silicon substrate 1 and this raises the avalanche voltage, with the result that the avalanche current is decreased as the humidity is increased, assuming the reverse voltage to be constant.

Figure 3:
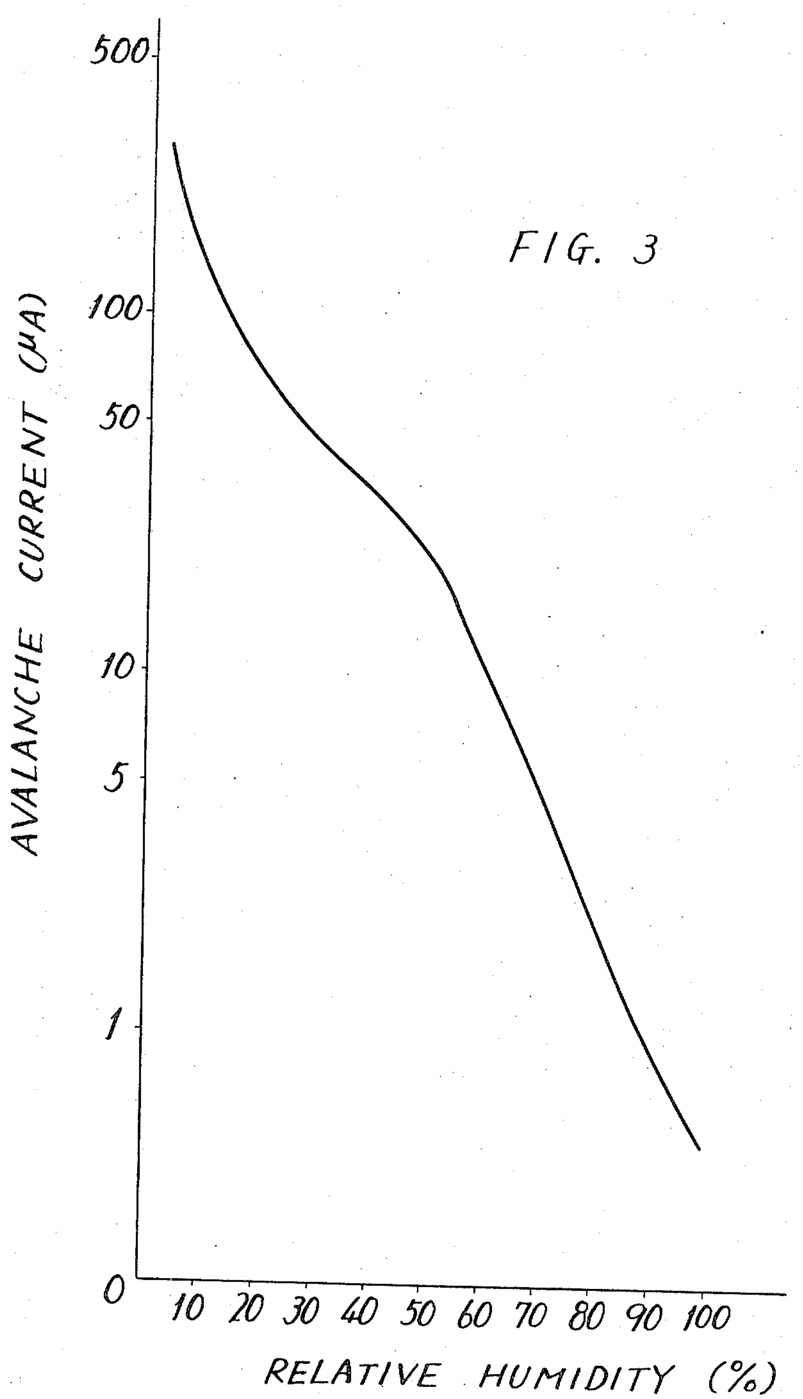
FIG. 3 is a graph showing a relation of the avalanche current versus the relative humidity taken with the composite as supplied with a constant reverse voltage (50V) higher than the breakdown voltage thereof.

A relation of the avalanche current of the composite as supplied with a constant reverse voltage with the relative humidity is better seen from a graph of FIG. 3, in which the ordinate indicates the reverse current of the abovementioned composite supplied with a bias voltage of 50 volt in a reverse direction and the abscissa indicates the relative humidity of the atmosphere, the measurement being made at 25°C.

As seen from the FIG. 3 graph, the semiconductor composite of the present invention shows higher sensitivity in particular in the lower humidity region. Another advantage of the semiconductor device of the present invention is that the decreased current in the higher humidity region is preferred to the semiconductor composite. However, most preferred advantages of the inventive semiconductor device are that the device is sensitive to so wide a range of the humidity in a very accurate manner, that the device is capable of responding to a change of humidity at a high response rate, say at least about 15 seconds to a full scale change of relative humidity from 100 percent to approximately 0 percent, that the humidity sensitive characteristic of the inventive composite is stable for a long period of time, particularly in view of the fact that the surface of the silicon substrate 1 as exposed to the atmosphere is later covered with a very thin film of chemically stabilized oxide such as silicon dioxide formed through natural oxidization of the substrate material and thus is protected from the atmosphere and tin oxide is also chemically stabilized, etc. Other advantages are that the inventive semiconductor device can be obtained with low cost and that the device is small-sized, etc.

Preferably silicon is employed as a semiconductor substrate material in manufacturing the FIG. 1 composite. It should be pointed out, however, that the surface of the silicon substrate is likely to be oxidized even at a normal temperature and as a result the silicon substrate as prepared for manufacture of semiconductor devices usually comprises a thin oxide film formed on the surface thereof. Such oxide film typically comprises $SiO_2$. Again it should be pointed out that an additional oxide film is formed on the surface of the substrate in the course of further depositing a tin oxide film on the surface. As a result it was found that the semiconductor composite as shown in FIG. 1 prepared in accordance with the teaching in the said referenced patent usually comprises a very thin insulating film, typically of $SiO_2$, of a thickness of a few A to approximately 10A incidentally formed between the tin oxide film and the substrate. Thus it would be readily understood that such undesired intervening layer of insulating film is inevitably formed, unless consideration is taken to eliminate such undesired layer.

With a view to investigating in detail what influence the $SiO_2$ layer incidentally formed between the $SnO_2$ layer and the Si substrate has upon performance of $SnO_2$-Si heterojunction of the composite as shown in FIG. 1, the inventors of the present application first removed the $SiO_2$ layer formed on the substrate surface through natural oxidization of the substrate material and then deposited an $SnO_2$ layer on the fresh surface of the substrate by a process and a means for eliminating formation of an $SiO_2$ layer on the substrate surface during deposition of the $SnO_2$ layer, so that a different composite can be provided, which comprises no substantial $SiO_2$ layer between the $SnO_2$ layer and the substrate of the composite. As a result, it was observed that the resultant $SnO_2$-Si composites are lack of uniformity in a reverse breakdown voltage, are of an increased reverse current and of a lowered reverse breakdown voltage. As readily understood by those skilled in the art, these changes in characteristics of the FIG. 1 composite are all disadvantageous in application of the composite as a humidity sensitive semiconductor device, particularly in view of the fact that the semiconductor device of the present invention is used with a specific reverse voltage applied as a bias. Thus the fact was confirmed that formation of the $SiO_2$ film at a junction region of the $SnO_2$-Si composite has not a little influence upon the characteristic of the semiconductor device of the present invention.

Nevertheless, the fact was also confirmed by experiment that the thickness of the $SiO_2$ film incidentally formed in the $SnO_2$-Si composite as shown in FIG. 1 manufactured in accordance with the teaching in the referenced patent does not exceed 15A. It is believed that usually such a very thin $SiO_2$ layer does not cover the whole surface of the silicon substrate or rather the substrate surface is studded with a plurality of small $SiO_2$ areas with irregularities of the film thickness and other film conditions. For this reason it is hardly possible to provide an $SnO_2$-Si composite of uniformity in characteristic as a humidity sensitive semiconductor device, resulting in unsatisfactory yield rate of manufacture of the device.

Figure 4:
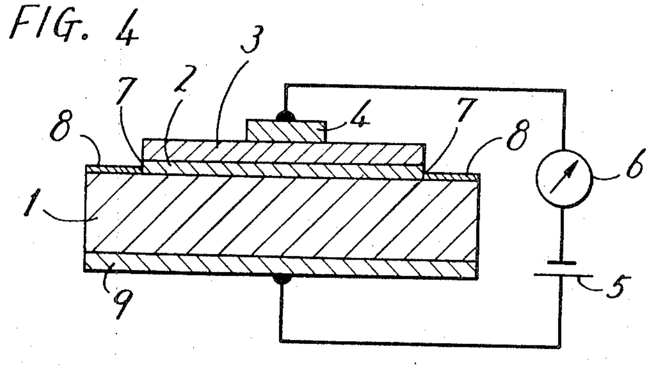
FIG. 4 shows a sectional view of a semiconductor device of a preferred embodiment of the present invention, which eliminates disadvantages involved in the FIG. 1 composite.

FIG. 4 shows a sectional view of a semiconductor device of a preferred embodiment of the present invention, which eliminates any problems discussed in conjunction with FIG. 1 embodiment in the preceding paragraphs. The composite shown basically comprises an N-type single crystal silicon substrate 1 with specific resistivity of 1 ohm cm, a layer 2 of silicon dioxide ($SiO_2$) formed on the said substrate 1, and a layer 3 of tin oxide or stannic oxide ($SnO_2$) further deposited on the said $SiO_2$ layer 2. The composite is also shown comprising a metal electrode 4 formed on the $SnO_2$ layer 3, a metal electrode 9 formed on the substrate 1 and a circuit connection, including an ammeter 6 and a reverse bias voltage source 5 connected to both electrodes 4 and 9.

The thickness of the $SiO_2$ film is chosen to be 15A to 500A, as to be more fully discussed subsequently. Thus it is seen that one of the most specific features of FIG. 4 embodiment is to form positively the $SiO_2$ layer between the $SnO_2$ layer and the Si substrate, contrary to expectation in the preceding discussion in conjunction with FIG. 1 embodiment. It was discovered that a composite of such structure and composition has also a rectifying characteristic and that such composite takes on a photoelectric function when radiation energy is supplied to the heterojunction formed inside the composite.

Figure 5:
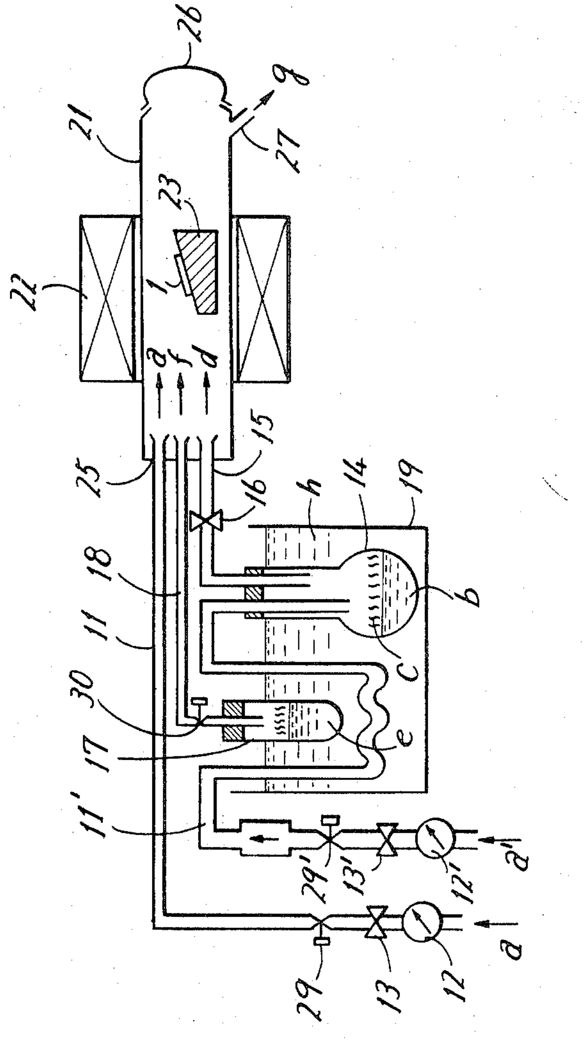
FIG. 5 shows a preferred arrangement of apparatus for manufacture of the composite shown in FIG. 4.

Referring now to FIG. 5, there is shown a preferred arrangement of apparatus for manufacture of the composite shown in FIG. 4. The apparatus shown comprises a quartz furnace tube 21 surrounded by an electric heater 22, which is capable of controllably heating the reaction zone of the furnace to 400°C-700°C. Three pipes 11, 18 and 15 are connected to an end wall 25 of the tube 21. The pipe 11 is used for supplying an oxidizing gas *a*, such as oxygen, air or a mixture of oxygen and nitrogen, therethrough into the tube 21 and is connected through a cock 29, a control valve 13 and a flow meter 12 to an oxidizing gas source as indicated as an arrow followed by the character *a*. The pipe 18 is used for supplying a water vapor *f* therethrough into the tube 21 and is connected through a cock 30 to an evaporator 17, which stores water *e*. The pipe 15 is used for supplying a mixture gas *d* of a dimethyl tin dichloride vapor *c* and an inert gas *a'* therethrough to the tube 21 and is connected through a control valve 16 to an evaporator 14, which stores a liquid *b* of dimethyl tin dichloride ($(CH_3)_2SnCl_2$). Both evaporators 17 and 14 are immersed into oil *h* housed in an oil bath 19 so that both evaporators may be controllably heated to 110°C–150°C by a heater (not shown). A pipe 11', connected to the evaporator 14 at one end thereof and partially immersed into the oil *h* of the oil bath 19, is connected through a cock 29', a control valve 13' and a flow meter 12' to an inert gas source as indicated as an arrow followed by the character *a'*. The other end of the furnace tube 21 is closed with a cap 26 and the gas in the furnace tube 21 is forced out of an exhaust gas outlet 27 at a given flow rate. A quartz board 23 is placed at a reaction zone of the furnace tube 21 and a silicon wafer 1 is placed on the board 23.

Now the steps for manufacturing the semiconductor composite shown in FIG. 4 by the use of the apparatus shown in FIG. 5 will be described by referring to FIG. 6, which shows sectional views of the semiconductor composite at various stages of the process.

Figure 6:
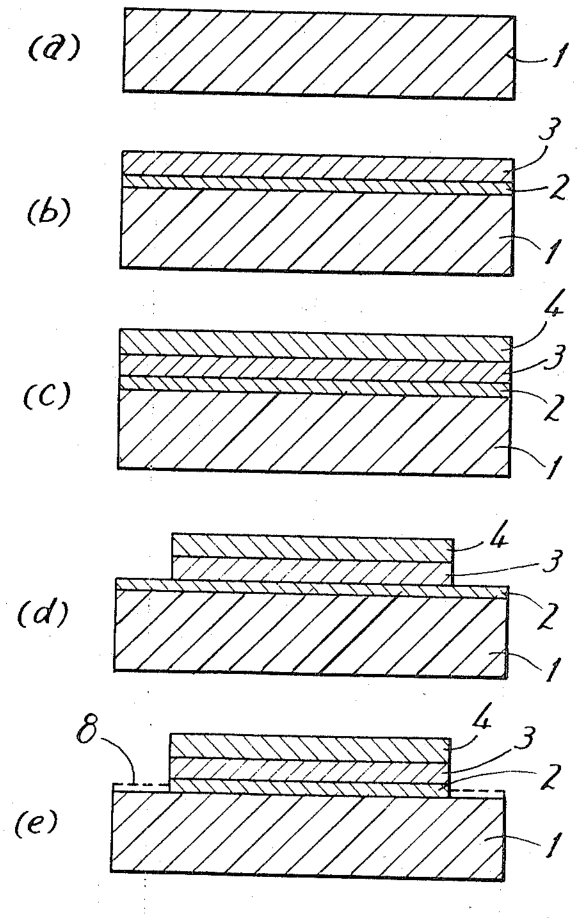
FIG. 6 shows sectional views of the FIG. 4 composite at various stages of the manufacturing process.

In preparation for manufacture of the composite of the present invention, an N-type silicon wafer 1 shown in (a) of FIG. 6, as processed physically or chemically so as to provide a mirror-polished or rough main surface, as the case may be, is washed by a diluted solution of hydrogen fluoride (HF) to remove an $SiO_2$ film which might have been formed on the main surface of the wafer 1. The wafer 1 is then placed on the board 23 and is inserted into the quartz furnace 21 so that it is positioned at the reaction zone of the pipe 21, as shown in FIG. 5. The silicon wafer 1 is then heated by means of the heater 22 up to 400°C through 600°C, and preferably to 520°C.

When the said silicon wafer 1 comes to be heated up to the prescribed temperature, the valve 13 and the cocks 29 and 30 are opened, so that the oxidizing gas *a* and the vapor *f* are supplied through the pipes 11 and 18, respectively, into the furnace tube 21 to provide an oxidizing atmosphere to the reaction zone. While the silicon wafer 1 is subjected to the oxidizing atmosphere for five minutes, for example, an $SiO_2$ film 2 of 20A in thickness is formed on the surface of the wafer 1. The thickness of the $SiO_2$ film is controllably selected as desired within the range of 15A through 500A, for example, as a function of the time period in which the wafer 1 is subjected to the said oxidizing atmosphere. However, in implementing an $SiO_2$ film thicker than 50A, the temperature of the furnace tube 21 may be raised to, say 700°C, thereby reducing the time period required for formation of the $SiO_2$ film of desired thickness without a substantial change of quality of the film. Selection of thickness of the $SiO_2$ film will be more fully discussed subsequently.

When the $SiO_2$ film of a desired thickness is formed on the wafer surface, the valve 13' and the cock 29' are also opened, so that an inert carrier gas *a'* is sent through the pipe 11' to the evaporator 14 which stores dimethyl tin dichloride *b*. As seen from FIG. 5, the inert gas *a'* is preheated to a certain temperature as it passes through a portion of the pipe 11' immersed into the oil bath 19. The oil bath 19 is heated by means of a heater (not shown), so that the oil *h* is kept heated to 110°C through 150°C and preferably to 135°C. Accordingly, the evaporator 14 is also heated to produce a vapor of dimethyl tin dichloride therein. The vapor of dimethyl tin dichloride filling within the evaporator 14 is carried together as the carrier gas *a'* passes through the evaporator 14 and a mixture gas *d* is introduced into the furnace tube 21, pressure of which is usually reduced by means of vacuum pump (not shown) connected to the exhaust outlet 27. Concurrently with supply of the mixture gas *d*, a water vapor *f* may also be introduced into the furnace tube 21, as necessary. It was observed that additional introduction of the water vapor into the furnace tube 21 during deposition of the $SnO_2$ film reduces the time period required for deposition of the $SnO_2$ film of desired thickness without a substantial change of quality of the film.

In the reaction zone, $O_2$ and $(CH_3)_2SnCl_2$ in the mixed gas *d* undergo pyrolysis and oxidization reaction, and a film of tin oxide is firmly deposited on the said $SiO_2$ film 2 on the surface of the silicon wafer 1. The sectional structure of the $SnO_2$-$SiO_2$-Si composite thus produced is shown in (b) of FIG. 6.

The process reaction can be described by the following equation:

$$(CH_3)_2SnCl_2 + O_2 \rightarrow SnO_2 + 2CH_3Cl$$

The tin oxide film formed by this method is of high optical transparency, its transmission rate being higher than 80–90 percent for light of wavelength 400m$\mu$–800m$\mu$. The film is also highly conductive. If desired, however, its conductivity can be further enhanced (resistivity diminished) by incorporation of a small amount of antimony trichloride ($SbCl_3$) into the dimethyl tin dichloride solution *b*.

The semiconductor composite as shown in (b) of FIG. 6 is caused to undergo vapor deposition of nickel (Ni), for example, so that a metal electrode layer 4 is formed on the $SnO_2$ film 3. The sectional structure of the composite as provided with the metal electrode layer 4 is shown in (c) of FIG. 6.

A peripheral portion of both the metal electrode layer 4 and the $SnO_2$ layer 3 are etched away to provide a semiconductor composite of structure as shown in (d) of FIG. 6 and then, using the remaining layers 4 and 3 as a mask, a corresponding peripheral portion of the $SiO_2$ is also etched away by a 5 percent solution of hydrogen fluoride to provide a semiconductor composite of structure as shown in (e) of FIG. 6.

It is seen that a peripheral portion of the barrier of the composite as shown in (e) of FIG. 6 is exposed to the atmosphere. However, as described previously, the fresh surface of the silicon wafer 1 thereafter comes to be covered with a very thin film 8 of oxide such as silicon dioxide, as shown in dotted lines in (e) of FIG. 6 through natural oxidization and in solid lines in FIG. 4. It is recalled that the said very thin $SiO_2$ film as formed through natural oxidization covers the peripheral portion of the barrier as well as the whole exposed surface of the wafer and serves to stabilize the characteristic of the semiconductor composite. For the same purpose, a similar film of $SiO_2$, for example, may be formed through an additional oxidization process, however. The metal electrode 9 is also formed on the under surface of the substrate by a suitable method and with a suitable material known to those skilled in the art.

It is recalled that the composite of the present invention has a photoelectric characteristic. However, the composite as shown in (e) of FIG. 6 is not sensitive to radiation energy, because the whole barrier area of the composite is covered with the metal electrode 4, which is opaque. The metal electrode 4, however, may be subsequently etched away, in part, to provide a small area electrode, as shown in FIG. 4. The composite of such structure allows radiation energy such as light energy to impinge upon the barrier. As a result a novel semiconductor device which is sensitive to both the ambient humidity and the incidental radiation energy.

It was discovered that an N-type silicon semiconductor is a suitable material for the substrate of said composite. However, a semiconductor composite of the like rectifying and humidity sensitive characteristic was also able to be implemented with the use of a P-type silicon semiconductor. In using a P-type material, however, it was found to be preferable to carry out the $SnO_2$ deposition reation at a somewhat higher temperature or to give a proper heat treatment to the composite made by $SnO_2$ deposition at the reaction temperature mentioned above. It was discovered that composites of a similar rectifying and humidity sensitive characteristic was also able to be manufactured with Ge, or GaAs as a substrate material. It was further observed that $Si_3N_4$ or $GeO_2$ may be used in place of $SiO_2$ as an insulating film formed between the $SnO_2$ film and the semiconductor substrate for the purpose of the present invention.

Now that the structural features of the composite of the preferred embodiment of the present invention have been described, various characteristic features of the composites as a humidity sensitive semiconductor device of FIG. 4 embodiment will be hereinafter discussed by referring to various graphs. It is pointed out that such various characteristics were obtained by using a specific example of the inventive composite comprising an N-type single crystal silicon substrate of 1 ohm cm in resistivity and of 2mm square and 200$\mu$ thick and a tin oxide film of 1mm $\phi$ and 0.6$\mu$ thick.

The inventors of the present application also discovered that the composite of such structure and composition shows a similar response to the ambient humidity in which the composite is placed. More specifically, the inventors discovered that the composite as described in conjunction with FIGS. 4 and 6 shows also different reverse voltage-current characteristic curves in the rectifying characteristic as a function of the ambient humidity. FIG. 2 graph shows at the same time such different reverse voltage-current characteristic curves of the FIG. 4 composite as designated by the reference characters A′, B′ and C′ with several values of the relative humidity as a parameter as indicated in parantheses of the respective curves. It is pointed out that the specific resistivity of the substrate material for use in the composite for the curves A, B and C in the FIG. 2 graph is 5 obm cm, whereas that for the curves A′, B′ and C′ is 1 ohm cm. It was observed by experiment that the decreased specific resistivity of the substrate material for use in the composite decreases the breakdown voltage of the composite. It was also observed that an increased time period for treatment of the composite with the hydrogen fluoride solution for removal of the $SiO_2$ film in the peripheral portion of the barrier also decreases the breakdown voltage of the composite. The curves A′, B′ and C′ were obtained with the composite of the FIG. 4 structure which underwent the treatment by 5 percent solution of hydrogen fluoride for 30 seconds. It is understood that the decreased breakdown voltage of the composite is more preferred in view of the fact that the reverse bias voltage required for the purpose of the present invention will be accordingly lowered.

Figure 7:
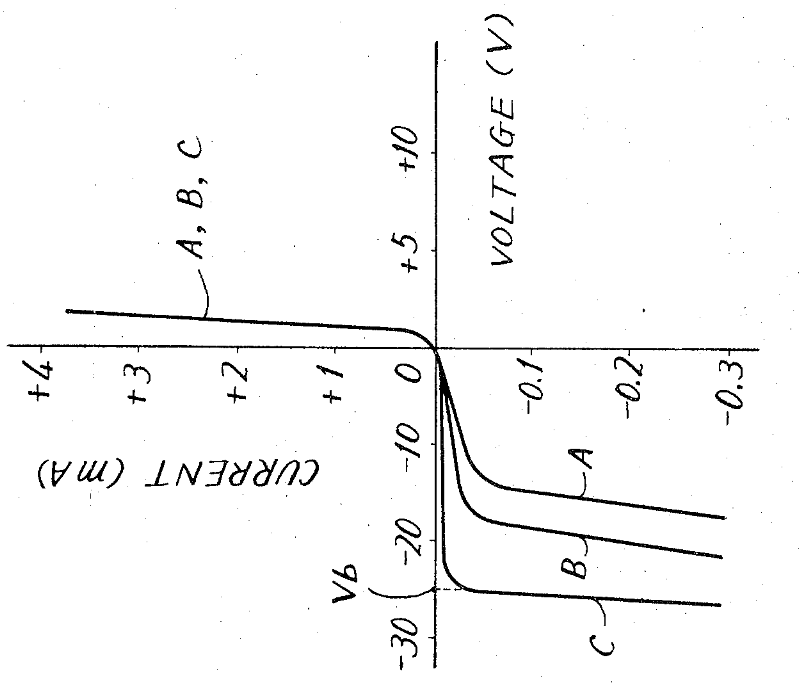
FIG. 7 is a graph showing a comparison of the rectifying characteristic of FIG. 4 composite with that of FIG. 1 composite.

FIG. 7 is a graph showing a comparison of the rectifying characteristic of the humidity sensitive semiconductor device of an $SnO_2$-$SiO_2$-Si composite structure as shown in FIG. 4 with that of the device of an $SnO_2$-Si composite structure as shown in FIG. 1. Curve C of FIG. 7 represents the rectifying characteristic of the FIG. 4 embodiment and curves A and B represent the rectifying characteristic of the FIG. 1 embodiment. The curve A was obtained using a composite as fabricated so that consideration was taken to eliminate formation of the $SiO_2$ film between the $SnO_2$ film and the Si substrate and the curve B was obtained using a composite as fabricated so that no such particular consideration was taken. As seen from the curves of the graph, a reverse leakage current or dark current of the device of FIG. 4 embodiment is much reduced as compared with the prior art device.

Figure 8:
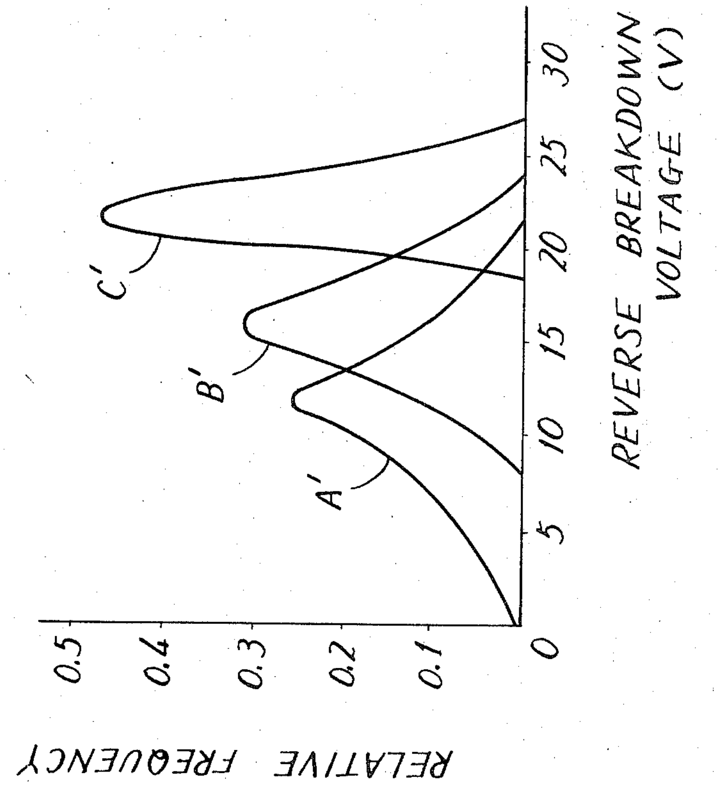
FIG. 8 is a graph showing another comparison in a statistical manner of the characteristic of FIG. 4 embodiment with that of FIG. 1 embodiment.

FIG. 8 is a graph showing another comparison in a statistical manner of the characteristic of the FIG. 4 embodiment with that of the FIG. 1 embodiment. In the graph, the ordinate represents relative frequency, while the abscissa represents the reverse breakdown voltage. Curve C′ of the graph shows a statistical distribution of the reverse breakdown voltage of the FIG. 4 embodiment, while curves A′ and B′ show that of the FIG. 1 embodiment. Again, the curve A was obtained using a composite as fabricated so that consideration was taken to eliminate formation of the $SiO_2$ film between the $SnO_2$ film and the Si substrate and the curve B was obtained using a composite as fabricated so that no such particular consideration was taken. As seen from the graph, the devices of FIG. 4 embodiment are very uniform in the reverse breakdown voltage, whereas such voltage of the devices of FIG. 1 embodiment is widely distributed.

Figure 9:
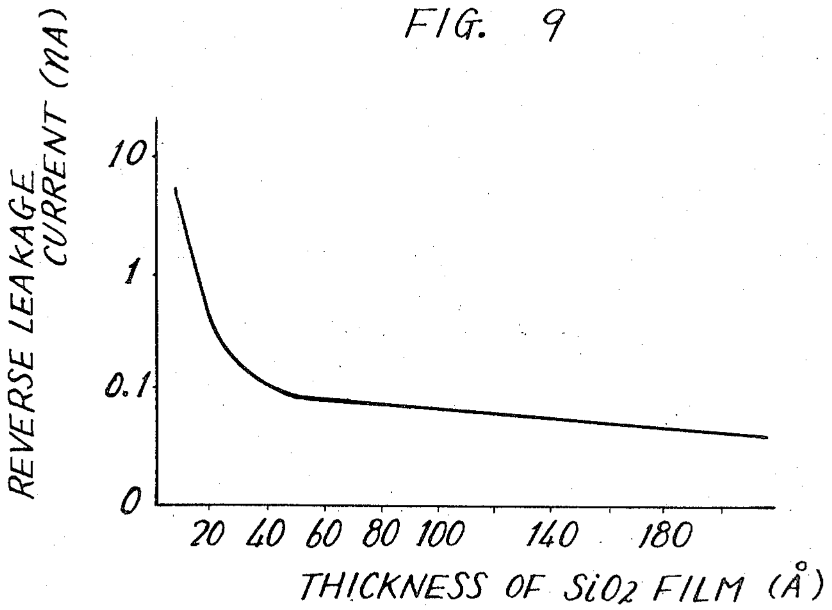
FIG. 9 is a graph showing a relation of reverse leakage current versus thickness of the $SiO_2$ film of the FIG. 4 embodiment in case where no radiation energy is supplied to the device.

FIG. 9 is a graph showing a relation of reverse leakage current versus thickness of the $SiO_2$ film of the FIG. 4 embodiment of the present invention in case where no radiation energy is supplied to the devices. As seen from the graph, the thicker the $SiO_2$ film is formed the more the reverse leakage current is reduced and, in particular, as the thickness of the $SiO_2$ film is increased from about 20A toward about 60A, the reverse leakage current is rapidly diminished. It was observed that as the thickness of the $SiO_2$ film is increased up to approximately 500A the reverse leakage current is accordingly reduced substantially to zero.

Figure 10:
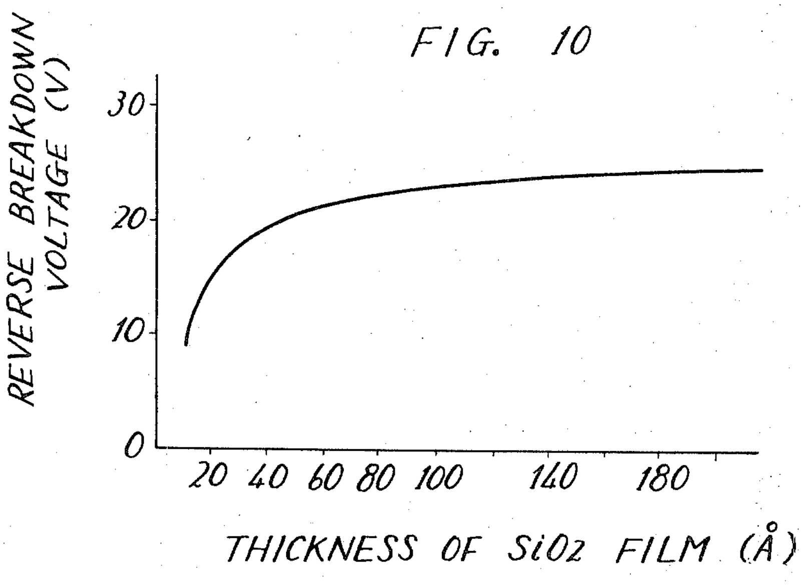
FIG. 10 is a graph showing a relation of the reverse breakdown voltage versus thickness of the $SiO_2$ film of the FIG. 4 embodiment in case where no radiation energy is supplied to the device.

FIG. 10 is a graph showing a relation of the reverse breakdown voltage versus thickness of the $SiO_2$ film of the FIG. 4 embodiment in case where no radiation energy is supplied to the device. As seen from the FIG. 7 graph, contrary to FIG. 9 graph, the thicker the $SiO_2$ film is formed the higher the reverse breakdown voltage becomes and likewise as the thickness of the $SiO_2$ film is increased from about 20A toward about 60A, the reverse breakdown voltage becomes rather rapidly higher. It is presumed that the change of the reverse breakdown voltage depending upon the thickness of the $SiO_2$ film results from the fact that the $SiO_2$ layer 2, as the thickness is increased, gradually comes to serve as an insulating film. On the other hand, the $SiO_2$ film of an increased thickness tends to degrade the rectifying characteristic of the device and to lower the humidity sensitivity of the device. For this reason it is preferred to select the thickness of the $SiO_2$ film less than 300A and additionally considering the manufacturing process it is more preferred to select the thickness of the film to less than 100A.

In the foregoing description as to a manufacturing process of the inventive device by referring to FIGs. 5 and 6, the $SiO_2$ layer as formed in the natural condition was completely removed by using a solution including hydrogen fluoride, before the $SiO_2$ layer is formed subsequently for the purpose of the present invention. The reason for removing the $SiO_2$ layer as formed in the natural condition is to facilitate controlling of the thickness of the $SiO_2$ film formed for the purpose of the present invention. More specifically, in general the thickness of the $SiO_2$ layer as formed in the natural condition of a silicon wafer prepared for manufacture of the inventive device is different or is not uniform depending upon the lapse of time since the wafer is cut and mirror-polished, environmental conditions in which the wafer is placed, etc. Therefore, formation of the $SiO_2$ film on the wafer for the purpose of the present invention in addition to and under the $SiO_2$ layer as formed in the natural condition makes the resultant $SiO_2$ layer uneven in thickness and in quality, resulting in lack of uniformity of the reverse voltage characteristic, leakage current, reverse breakdown voltage, etc. By contrast, the abovementioned pretreatment for removal of the undesired $SiO_2$ layer eliminates such a problem and improves the yeild rate of manufacture. However, the $SiO_2$ layer as naturally formed need not necessarily removed completely, if the layer of even thickness is left behind as a result of the said pretreatment, such film may be used as a portion of the $SiO_2$ layer subsequently formed for the purpose of the present invention by properly controlling the oxidization condition by the oxidizing gas a, such as a temperature and a time period for oxidization.

While specific preferred embodiments of the invention have been described, it will be apparant that obvious variations and modifications of the invention will occur to those skilled in the art from a consideration of the foregoing description. It is therefore desired that the present invention be limited only by the appended claims:

What is claimed is:

1. A humidity sensitive semiconductor device comprising: a semiconductor composite comprising a semiconductor substrate, a tin oxide layer deposited on said semiconductor substrate and metal electrodes deposited on said tin oxide layer and the substrate, said semiconductor composite forming a barrier between said tin oxide layer and said semiconductor substrate having a rectifying characteristic, said barrier being exposed to atmosphere;

means for supplying a reverse bias voltage to said semiconductor composite, said reverse bias voltage exceeding the reverse breakdown voltage of said semiconductor composite in the reverse direction; and means for determining the ambient humidity in terms of the reverse current of said semiconductor composite.

2. The humidity sensitive semiconductor device in accordance with claim 1, in which said semiconductor is a member selected from the group consisting of Si, Ge and GaAs.

3. The humidity sensitive semiconductor device in accordance with claim 1, in which said semiconductor is Si.

4. The humidity sensitive semiconductor device in accordance with claim 1, in which said semiconductor is N-type conductivity Si.

5. The humidity sensitive semiconductor device in accordance with claim 1, in which said semiconductor composite further comprises an insulating material layer formed between said tin oxide layer and said semiconductor substrate.

6. The humidity sensitive semiconductor device in accordance with claim 5, in which said insulating material is a semiconductor compound.

7. The humidity sensitive semiconductor device in accordance with claim 5, in which said insulating material is a member selected from a group consisting of $SiO_2$, $Si_3N_4$ and $GeO_2$.

8. The humidity sensitive semiconductor device in accordance with claim 5, in which said insulating material is $SiO_2$.

9. The humidity sensitive semiconductor device in accordance with claim 8, in which the thickness of the $SiO_2$ layer is chosen to be approximately 15A to 500A.

10. The humidity sensitive semiconductor device in accordance with claim 8, in which the thickness of the $SiO_2$ layer is chosen to be 15A to 300A.

11. The humidity sensitive semiconductor device in accordance with claim 8, in which the thickness of the $SiO_2$ layer is chosen to be 20A to 100A.

12. The humidity sensitive semiconductor device in accordance with claim 8, in which the thickness of the $SiO_2$ layer is chosen to be 20A to 50A.

13. The humidity sensitive semiconductor device in accordance with claim 8, in which the thickness of the $SiO_2$ layer is chosen to be 50A to 100A.

14. The humidity sensitive semiconductor device in accordance with claim 1, in which said semiconductor substrate of the composite comprises a main surface, and said tin oxide layer is deposited on a portion of said main surface of the substrate.

15. The humidity sensitive semiconductor device in accordance with claim 1, in which said rectifying barrier formed between the tin oxide layer and the substrate is exposed, at least in part, to the atmosphere.

16. The humidity sensitive semiconductor device in accordance with claim 1, in which said semiconductor composite further comprises an opaque material layer deposited on said tin oxide layer.

17. The humidity sensitive semiconductor device in accordance with claim 16, in which said opaque material is a metal of said electrode.

18. The humidity sensitive semiconductor device in accordance with claim 17, in which said metal is Ni.

19. The humidity sensitive semiconductor device in accordance with claim 1, in which said metal electrode formed on said tin oxide layer is Ni.

20. The humidity sensitive semiconductor device in accordance with claim 1, in which said metal electrode is deposited on a portion of said tin oxide layer.

21. In a semiconductive composite wherein a semiconductor substrate has deposited thereon a thin layer of $SnO_2$ forming a rectifying barrier heterojunction and having metal electrodes on the substrate and $SnO_2$ layer;

the improvement which comprises:

means for appying an avalanche regime reverse bias voltage to the semiconductive composite;

means for exposing at least a portion of the rectifying barrier to ambient atmosphere; and means for measuring ambient humidity as a function of avalanche current.

22. The composite of claim 21 wherein the reverse bias voltage is a substantially constant DC potential greater than a breakdown voltage of the composite.

23. The composite of claim 21 wherein the semiconductor consists essentially Si, Ge or GaAs.

24. The composite of claim 21 wherein an insulating material layer about 15A to 500A thick is formed between the $SnO_2$ layer and the semiconductor substrate.

25. The composite of claim 24 wherein the insulating material is a semiconductor compound consisting essentially of $SiO_2$, $Si_3N_4$ or $GeO_2$.

26. The composite of claim 25 wherein the insulating material consists essentially of a layer of $SiO_2$ about 20A to 100A thick, and the semiconductor substrate consists essentially of N-type single crystal silicon.

27. A composite according to claim 21 wherein a 100 percent relative humidity change is sensed in at least about 15 seconds.

* * * * *

UNITED STATES PATENT OFFICE

CERTIFICATE OF CORRECTION

Patent No. 3,790,869 Dated February 5, 1974

Inventor(s) Shigeru Tanimura; Nobuaki Miura, Osamu Asano & Nobuyuki Yamamura

It is certified that error appears in the above-identified patent and that said Letters Patent are hereby corrected as shown below:

Column 14, line 14, change "regime" to -- region --

Signed and sealed this 9th day of July 1974.

(SEAL)
Attest:

McCOY M. GIBSON, JR.
Attesting Officer

C. MARSHALL DANN
Commissioner of Patents